(12) United States Patent
Parker

(10) Patent No.: US 6,694,068 B2
(45) Date of Patent: Feb. 17, 2004

(54) PCB EMBEDDED AND SURFACE MOUNTED OPTICAL DISTRIBUTION SYSTEMS

(75) Inventor: John LeRoy Parker, Mechanicsville, VA (US)

(73) Assignee: Viasystems Technologies Corp., St. Louis, MO (US)

(*) Notice: Subject to any disclaimer, the term of this patent is extended or adjusted under 35 U.S.C. 154(b) by 0 days.

(21) Appl. No.: 09/992,810

(22) Filed: Nov. 19, 2001

(65) Prior Publication Data

US 2002/0141163 A1 Oct. 3, 2002

Related U.S. Application Data

(60) Provisional application No. 60/249,542, filed on Nov. 17, 2000.

(51) Int. Cl.[7] ................................................. G02B 6/12
(52) U.S. Cl. ......................... 385/14; 385/114; 385/15; 385/50; 385/49; 385/89
(58) Field of Search ........................... 385/14, 15, 50, 385/51, 52, 49, 88, 89, 114, 100, 18, 24

(56) References Cited

U.S. PATENT DOCUMENTS

| | | | |
|---|---|---|---|
| 6,233,376 B1 | * | 5/2001 | Updegrove .................... 385/14 |
| 6,236,786 B1 | * | 5/2001 | Aoki et al. .................... 385/50 |
| 2001/0164113 | * | 11/2002 | Rensing et al. ................ 385/18 |

* cited by examiner

Primary Examiner—Hemang Sanghavi
(74) Attorney, Agent, or Firm—Dunlap, Codding & Rogers, P.C.

(57) ABSTRACT

An optical cable is embedded in a printed circuit board using a MEMS mirror to steer the photonic signal from the surface of the board to the optical cable embedded in the board's interior. The photonic signal is conducted from the surface to the embedded mirror by way of a vertical optical via. Such optical vias are used as well for coupling photonic signals between plural optical layers formed by plural flat optical cables. Some or all of the plural flat optical cables are internal to the printed circuit board. Other steering devices may be used that provide equivalent function to that of the mirrors.

1 Claim, 3 Drawing Sheets

PCB EMBEDDED AND SURFACE MOUNTED OPTICAL DISTRIBUTION SYSTEMS

CROSS REFERENCE TO RELATED APPLICATIONS

This application claims priority under 35 U.S.C. §119(e) from provisional application No. 60/249,542, filed Nov. 17, 2000. The No. 60/249,542 provisional application is incorporated by reference herein, in its entirety, for all purposes.

INTRODUCTION

The present invention relates generally to the field of printed circuit boards. More particularly, the present invention relates to multi-level printed circuit boards that integrate optical distribution with electrical aspects.

BACKGROUND OF THE INVENTION

Hybrid systems that combine optical fibers with conventional printed circuit boards have been less than robust. Reliability of such systems remains a concern.

Thus, what is needed is a robust system for combining photonic signal handling via optical fibers with printed circuit board technology.

SUMMARY OF THE INVENTION

It is an object of the present invention to facilitate routing of optical signals.

It is another object of the present invention to automate the construction and assembly of a printed circuit board with optical cables.

It is yet another object of the present invention to insure product uniformity by using a flat optical cable with a specified footprint for a specified printed circuit board design.

It is still another object of the present invention to provide protection for an optical cable combined with a printed circuit board, as well as the optical fibers in the cable.

It is a further object of the present invention to provide protection for cable connector or electro-optical device interface.

It is an additional object of the present invention to prevent bending of the optical fibers that can attenuate optical transmission or fracture optical fibers.

According to one embodiment of the present invention, a flat optical cable is attached to one or more layers to a PCB or backplane. Attachment is preferably via an adhesive. Of course, suitable equivalent attachment mechanisms may be used.

According to another embodiment of the present invention, an optical cable is embedded in a PCB using a MEMS mirror (or an equivalent steering device) to steer the photonic signal from the surface of the board to the interior as well as between optical layers some or all of which may be internal.

According to a third embodiment of the present invention, dynamic MEMS mirrors (or equivalent dynamic devices) are incorporated into a multilevel printed circuit board (or backplane) to steer and thereby switch photonic signals within the PCB.

BRIEF DESCRIPTION OF THE DRAWINGS

Additional objects and advantages of the present invention will be apparent in the following detailed description read in conjunction with the accompanying drawing figures.

DETAILED DESCRIPTION OF THE INVENTION

The present invention integrates optical circuits into backplanes (or, more generally, printed circuit boards. This enables ease of connection and disconnection of circuit boards to one another when the signals flowing between the boards are both optical and electrical.

According to one embodiment of the present invention, a flat optical cable is attached to one or more layers to a PCB or backplane. Attachment is preferably via an adhesive. Of course, suitable equivalent attachment mechanisms may be used.

This embodiment provides a number of advantages. It facilitates routing of optical signals. It permits the assembly of a PCB with optical cable using automated construction.

This embodiment also insures product uniformity by using a flat optical cable with a specified footprint for a specified PCB design. It protects the cable and optical fibers, and it also protects the cable/connector or device interfaces. It also prevents bending of the optical fibers which can attenuate optical transmission or fracture optical fibers.

Figure 1:
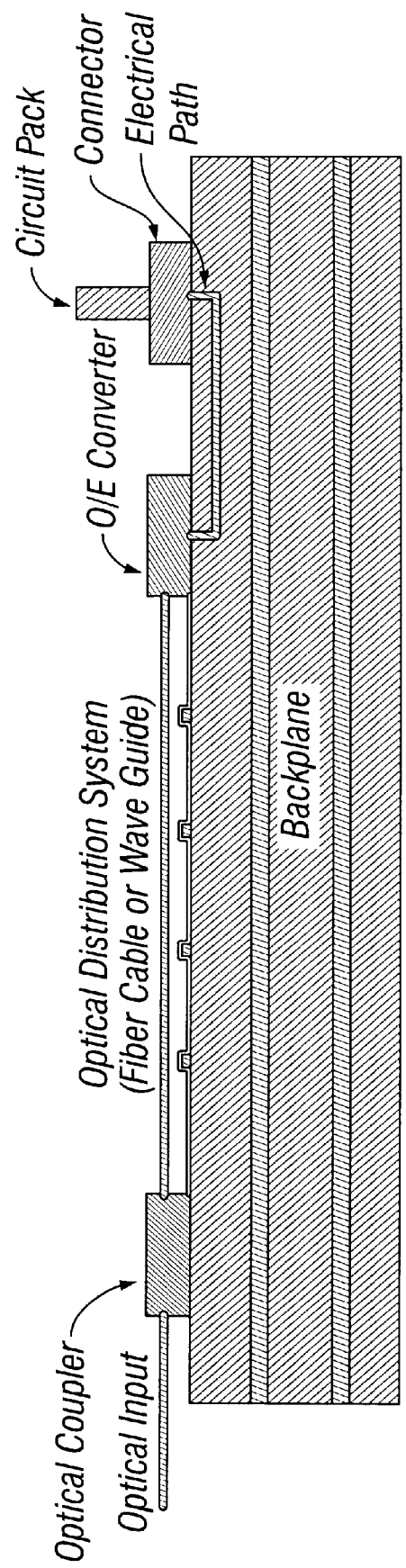
FIG. 1 illustrates a sectional view of an electro-optical printed circuit board according to an embodiment of the present invention.

Referring to FIG. 1, a sectional view of an electro-optical printed circuit board according to this first embodiment of the present invention is illustrated. A backplane has multiple layers, constructed generally in a manner as is understood in the art. Plural circuit packs (one shown) plug into the backplane via electrical connectors. Optical signals enter the backplane from optical fibers that connect at an optical coupler. The optical signals are conducted across the backplane via an optical distribution system that is fastened down to the surface of the backplane. The optical distribution system may be embodied as a fiber cable or as one or more wave guides.

The interfacing of the optical signals and the circuit packs is accomplished by conversion optical signals to electric (and vice versa) by O/E converters that are connected to the optical distribution system. Electrical signals are coupled between the O/E converters and the connectors via electrical paths. Generally, the electrical paths may be placed along the surface of the backplane board or embedded therein (as shown).

According to the embodiment of FIG. 1, only electrical paths are embedded inside the backplane board, with the optical paths being fastened on the surface of the backplane board.

According to a second embodiment of the present invention, an optical cable is embedded in a PCB using a MEMS mirror (or an equivalent steering device) to steer the photonic signal from the surface of the board to the interior as well as between optical layers some or all of which may be internal.

One aspect of the invention according to this embodiment is a novel concept for replacing surface photonics with a more robust technology that embeds optical elements in the board.

A second aspect of the invention according to this embodiment is a novel concept for a right angle optical connector using a MEMS mirror or other means for steering photonic signals through a 90 degree turn. Deflecting optical fibers into a 90 degree bend creates both mechanical and transmissive issues that are avoided by this aspect of the invention.

A third aspect of the invention according to this embodiment is a novel technique for interconnecting the surface optics to an embedded optical transport system.

One advantage of the embedding optical elements in the board is that it facilitates routing of optical signals. It also permits the assembly of a PCB with optical cable using automated construction.

Using a flat optical cable with a specified footprint for a specified PCB design ensures product uniformity. Embedding the optical cable and optical fibers protects them, as well as the cable/connector or device interfaces. The embedded optical fibers are prevented from the bending that can attenuate optical transmission or fracture optical fibers.

Figure 2:
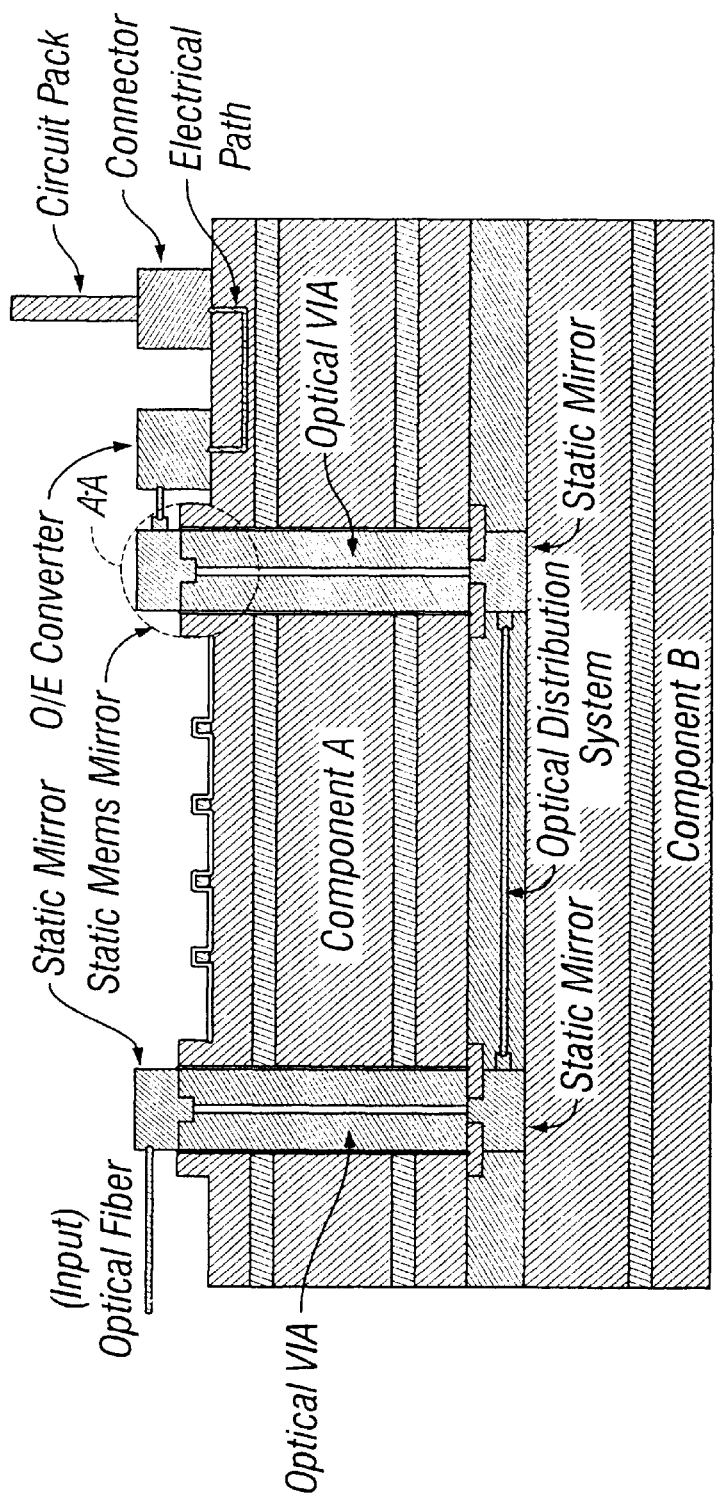
FIG. 2 illustrates a sectional view of an electro-optical printed circuit board according to other embodiments of the present invention.
Figure 2:
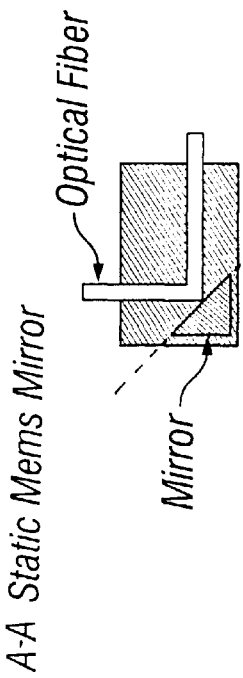

Referring to FIG. 2, a sectional view of an electro-optical printed circuit board according to this second embodiment of the present invention is illustrated. Plural circuit packs (one shown) plug into the multi-layer backplane via electrical connectors. Optical signals enter the backplane from optical fibers that connect at an optical coupler. The optical signals are conducted across the backplane via an optical distribution system that is embedded beneath the surface of the backplane. Optical vias conduct the optical signals between components on the surface and the embedded optical distribution system.

The optical distribution system is disposed horizontally (i.e., in a plane parallel to the planes of the layers of the backplane board), with the connecting vias running vertically through the board. An optical via is shown for conducting optical signals between the input optical fiber and the optical distribution system. Conversions between the horizontal and vertical path orientations are facilitated by 90 degree static mirrors.

The interfacing of the optical signals and the circuit packs is accomplished by conversion optical signals to electric (and vice versa) by O/E converters that are connected to the optical distribution system by way of a vertical optical via. Electrical signals are coupled between the O/E converters and the connectors via electrical paths. The electrical paths may be embedded beneath the surface of the backplane board (as shown). Optionally, the electrical paths may be placed along the surface According to the embodiment of FIG. 2, both electrical paths and optical paths may be embedded inside the backplane board.

Figure 3:
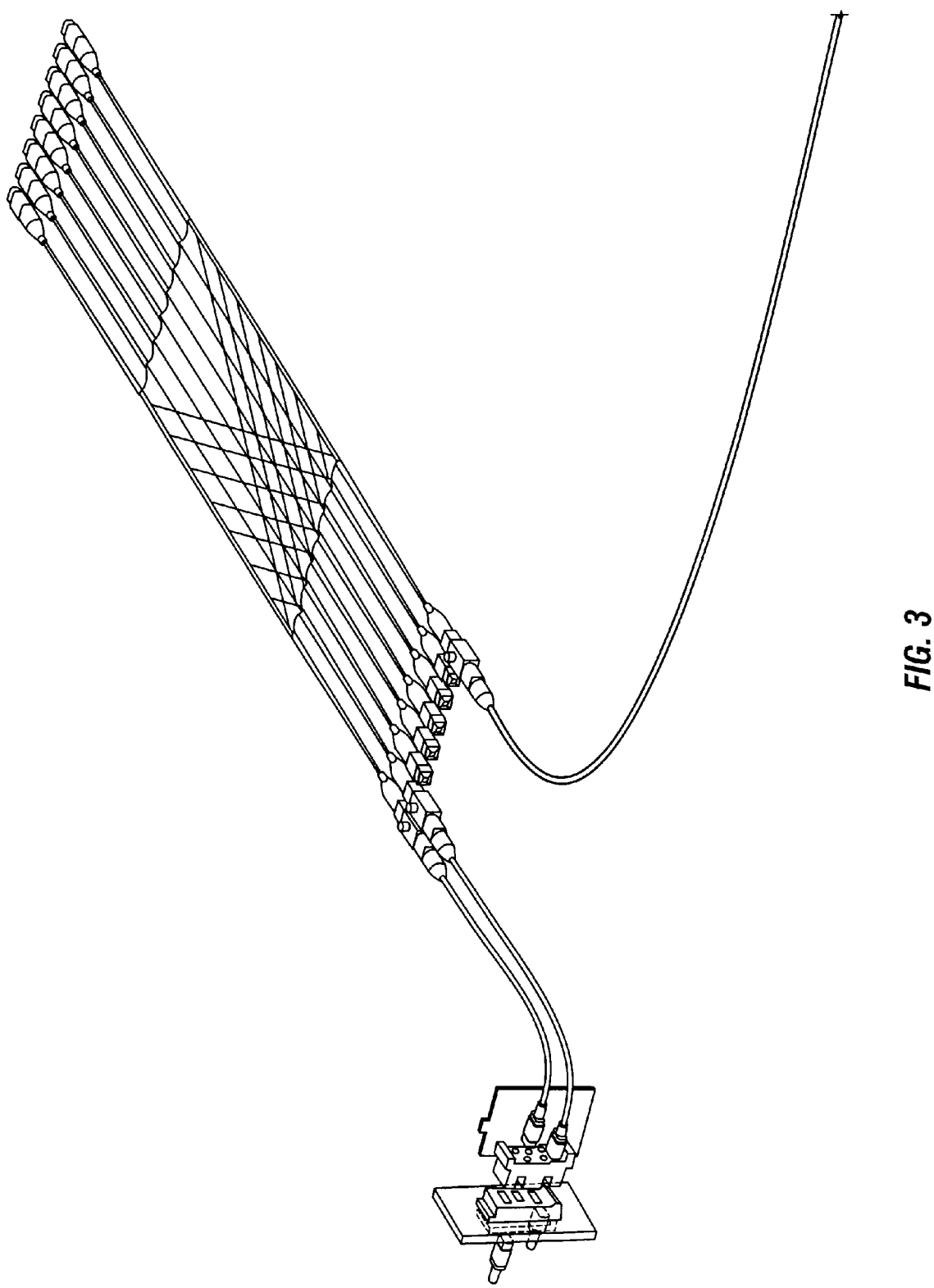
FIG. 3 illustrates a perspective view of an optical fiber cable suitable for use in the present invention.

Referring to FIG. 3, a perspective view of an optical fiber cable suitable for use in the present invention is illustrated.

According to a third embodiment of the present invention, dynamic MEMS mirrors (or equivalent devices) are incorporated into a multilevel printed circuit board (or backplane) to steer and thereby switch photonic signals within the PCB.

The present invention has been described in terms of preferred embodiments, however, it will be appreciated that various modifications and improvements may be made to the described embodiments without departing from the scope of the invention.

What is claimed is:

1. A printed circuit board having multiple layers, the printed circuit board comprising:

a flat optical cable having a predetermined footprint, the flat optical cable being embedded horizontally within the layers of the printed circuit board;

plural optical vias disposed vertically through one or more layers of the printed circuit board; and plural mirrors embedded within the printed circuit board and disposed so as to provide from a right angle translation of light between the flat optical cable and corresponding ones of the optical vias;

wherein conduction of light is provided between a surface of the printed circuit board and the flat optical cable by way of the plural optical vias and the plural mirrors.

* * * * *